United States Patent
Okumura

(10) Patent No.: US 9,901,005 B2
(45) Date of Patent: Feb. 20, 2018

(54) VIBRATION SUPPRESSION MECHANISM FOR AN ELECTRONIC DEVICE

(71) Applicant: NEC Corporation, Minato-ku, Tokyo (JP)

(72) Inventor: Kenji Okumura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/229,099

(22) Filed: Mar. 28, 2014

(65) Prior Publication Data

US 2014/0299737 A1    Oct. 9, 2014

(30) Foreign Application Priority Data

Apr. 5, 2013  (JP) .................................. 2013-079740

(51) Int. Cl.
 *H05K 7/14* (2006.01)
 *H05K 5/02* (2006.01)
 (Continued)

(52) U.S. Cl.
 CPC ......... *H05K 7/1487* (2013.01); *F16F 1/3732* (2013.01); *F16F 1/38* (2013.01);
 (Continued)

(58) Field of Classification Search
 CPC . F16F 1/3732; F16F 1/38; F16F 15/08; G11B 33/08; H05K 7/1487; H05K 7/1489; G06F 1/187
 (Continued)

(56) References Cited

U.S. PATENT DOCUMENTS 4,713,714 A * 12/1987 Gatti et al. .................... 360/137
4,908,715 A *  3/1990 Krum ..................... G11B 33/08
                                                               360/99.25
(Continued)

FOREIGN PATENT DOCUMENTS

CN    1396501 A    2/2003
CN    1734391 A    2/2006
(Continued)

OTHER PUBLICATIONS

Japanese Office Action for JP Application No. 2013-079740 dated Feb. 12, 2014 with English Translation.
(Continued)

*Primary Examiner* — Eret C McNichols

(57) ABSTRACT

Provided is a vibration suppression mechanism for an electronic device, which efficiently absorbs vibrations that adversely affect operation of the electronic device. The vibration suppression mechanism for the electronic device includes a holding unit that is constructed such that a vibration absorbing member is used at a contacting portion on a first surface of a holding member and a contact member protruding from a second surface of the holding member which is opposite to the first surface is held by the vibration absorbing member, the holding unit supporting the electronic device via the vibration absorbing member used at the contacting portion on the first surface or the contact member protruding from the second surface, and a housing for holding the holding unit in a mounted state under a state in which the contact member protruding from the second surface or the vibration absorbing member used at the contacting portion on the first surface abuts against a holding structure.

4 Claims, 12 Drawing Sheets

(51) Int. Cl.
*F16F 1/38* (2006.01)
*F16F 1/373* (2006.01)
*F16F 15/08* (2006.01)
*G06F 1/16* (2006.01)
*G06F 1/18* (2006.01)
*G11B 33/08* (2006.01)
*G11B 33/02* (2006.01)

(52) U.S. Cl.
CPC ............ *F16F 15/08* (2013.01); *G06F 1/1658* (2013.01); *G06F 1/187* (2013.01); *G11B 33/022* (2013.01); *G11B 33/08* (2013.01); *H05K 5/0217* (2013.01); *H05K 7/14* (2013.01); *H05K 7/1489* (2013.01)

(58) Field of Classification Search
USPC .................................................... 361/679.36
See application file for complete search history.

(56) References Cited

U.S. PATENT DOCUMENTS

| | | | |
|---|---|---|---|
| 5,192,143 A | 3/1993 | Lajara et al. | |
| 6,000,654 A * | 12/1999 | Hirabayashi | G11B 33/124 242/338.4 |
| 6,002,588 A * | 12/1999 | Vos | F16F 7/14 174/138 G |
| 6,373,696 B1 | 4/2002 | Bolognia et al. | |
| 6,511,038 B1 * | 1/2003 | Han | B60G 99/00 248/188.8 |
| 6,809,916 B2 | 10/2004 | Nakata | F16F 1/025 361/115 |
| 7,019,966 B2 | 3/2006 | Lee | |
| 7,092,250 B2 | 8/2006 | Chen et al. | |
| 7,137,767 B2 * | 11/2006 | Franke | F16F 1/3732 248/224.8 |
| 7,352,569 B2 * | 4/2008 | Muenzer | G06F 1/181 312/223.2 |
| 7,616,436 B2 * | 11/2009 | DeMoss et al. | 361/679.34 |
| 7,656,655 B2 * | 2/2010 | Fan | G06F 1/182 361/679.33 |
| 7,679,896 B2 | 3/2010 | Deng et al. | |
| 7,684,182 B2 | 3/2010 | Zhang et al. | |
| 7,697,278 B2 | 4/2010 | Peng et al. | |
| 7,701,703 B2 | 4/2010 | Peng et al. | |
| 7,701,706 B2 | 4/2010 | Peng et al. | |
| 7,839,639 B2 * | 11/2010 | Najbert | 361/695 |
| 7,848,096 B2 | 12/2010 | Peng et al. | |
| 7,967,281 B2 * | 6/2011 | Rawson | 267/141.7 |
| 8,004,830 B2 | 8/2011 | Lu | |
| 8,087,739 B2 | 1/2012 | Chen | |
| 8,159,816 B2 | 4/2012 | Chen | |
| 8,474,804 B2 * | 7/2013 | Masterson et al. | 267/141 |
| 8,644,028 B2 * | 2/2014 | Qin | H05K 7/142 361/758 |
| 8,982,550 B2 * | 3/2015 | Kaneko | G06F 1/187 361/679.34 |
| 9,116,674 B2 * | 8/2015 | Merz | G02F 1/133308 |
| 9,207,709 B2 * | 12/2015 | Xie | G06F 1/16 |
| 9,265,183 B2 | 2/2016 | Sun et al. | |
| 9,352,700 B2 | 5/2016 | Prin et al. | |
| 9,520,158 B1 * | 12/2016 | Lyu | G11B 33/124 |
| 2003/0016493 A1 | 1/2003 | Hiratomo et al. | |
| 2006/0139868 A1 * | 6/2006 | Hood | G06F 1/181 361/679.33 |
| 2007/0030639 A1 | 2/2007 | Ko | |
| 2007/0035920 A1 | 2/2007 | Peng et al. | |
| 2007/0127204 A1 | 6/2007 | Muenzer et al. | |
| 2007/0195497 A1 | 8/2007 | Atkins | |
| 2007/0211422 A1 | 9/2007 | Liu et al. | |
| 2007/0297129 A1 | 12/2007 | Liu et al. | |
| 2008/0259554 A1 | 10/2008 | Qin et al. | |
| 2008/0284074 A1 | 11/2008 | Lim et al. | |
| 2008/0285225 A1 | 11/2008 | DeMoss et al. | |
| 2008/0316698 A1 | 12/2008 | Yeh et al. | |
| 2009/0040705 A1 | 2/2009 | Tatsukami | |
| 2009/0284910 A1 * | 11/2009 | Heo et al. | 361/679.36 |
| 2010/0027231 A1 * | 2/2010 | Chang et al. | 361/807 |
| 2010/0103607 A1 | 4/2010 | Chen et al. | |
| 2010/0187957 A1 | 7/2010 | Liang | |
| 2010/0192335 A1 * | 8/2010 | Ukai et al. | 24/591.1 |
| 2010/0271773 A1 | 10/2010 | Ye | |
| 2010/0288898 A1 | 11/2010 | Peng et al. | |
| 2010/0294902 A1 | 11/2010 | Zhang et al. | |
| 2011/0001280 A1 * | 1/2011 | Huang | 267/140.4 |
| 2011/0013355 A1 | 1/2011 | Chen | |
| 2011/0075348 A1 | 3/2011 | Li | |
| 2011/0255235 A1 | 10/2011 | Chen | |
| 2012/0087083 A1 | 4/2012 | Yeh et al. | |
| 2012/0136477 A1 | 5/2012 | Merrow et al. | |
| 2012/0155012 A1 | 6/2012 | Guo et al. | |
| 2013/0048813 A1 | 2/2013 | Liu et al. | |
| 2015/0107948 A1 * | 4/2015 | Gustavsson | 188/380 |

FOREIGN PATENT DOCUMENTS

| | | |
|---|---|---|
| CN | 1856224 A | 11/2006 |
| CN | 101308696 A | 11/2008 |
| CN | 101364133 A | 2/2009 |
| JP | 2007-505425 A | 3/2007 |
| JP | 3130774 U | 4/2007 |
| JP | 2008-171515 A | 7/2008 |
| JP | 2009-70530 A | 4/2009 |
| JP | 2011-524059 A | 8/2011 |

OTHER PUBLICATIONS

U.S. Office Action for Co-Pending U.S. Appl. No. 15/242,816 with PTO-892 dated Jul. 13, 2017.

Notice of Allowance for U.S. Appl. No. 15/242,816, dated Nov. 9, 2017.

Chinese Office Action for CN Application No. 201410122647.1 dated Nov. 3, 2017 with English Translation.

* cited by examiner (a)

(b)

(c)

(d)

(e)

VIBRATION SUPPRESSION MECHANISM FOR AN ELECTRONIC DEVICE

This application is based upon and claims the benefit of priority from Japanese patent application No. 2013-79740, filed on Apr. 5, 2013, the disclosure of which is incorporated herein in its entirety by reference.

BACKGROUND OF THE INVENTION

1. Field of the Invention

This invention relates to an information processing system in which an electronic device is removably connected, and more particularly, to a structure for suppressing vibrations which affect operation of an electronic device.

2. Description of the Related Art

In an information processing apparatus, structure design using a mountable/removable electronic device is often made.

In this structure design, not only the mountability/removability of the electronic device but also various other design factors are considered. Many factors including electrical connection, integration scale, cooling, vibrations, energy efficiency, and specifications are comprehensively considered.

In many information processing apparatuses, as a shock absorbing structure for reducing shock and vibrations to an electronic device, a rubber (elastomer), sponge, or gel material is used as a shock absorbing member between the electronic device and a housing.

Japanese Unexamined Patent Application Publication (JP-A) No. 2009-70530 and Japanese Utility Model Registration No. 3130774 describe exemplary structures in which a rubber (elastomer), sponge, or gel material is used as a damper.

Japanese Unexamined Patent Application Publication (JP-A) No. 2009-70530 is a document which describes a structure for a hard disk drive (HDD) to be integrated into in-vehicle electronic equipment. Japanese Utility Model Registration No. 3130774 is a document which describes a structure for an HDD to be integrated into a personal computer. These documents disclose insertion/extraction structures which suppress vibrations (shock) to an electronic device from the outside.

By the way, excellent vibration absorbing members to be used for suppressing vibrations to an electronic device and vibrations from an electronic device have been developed. Such vibration absorbing members absorb and suppress vibrations by converting vibrational energy into thermal energy or the like. Further, such vibration absorbing members also have the conventional function of suppressing transmission of oscillatory waves. The energy conversion is realized using friction between elements in the member or the like. Such vibration absorbing members are commercialized by, for example, E-A-R Specialty Composites.

An information processing apparatus may have effective shock absorbing effects by adopting the structure disclosed in Japanese Unexamined Patent Application Publication (JP-A) No. 2009-70530 or Japanese Utility Model Registration No. 3130774. On the other hand, it is necessary to improve the effect of suppressing vibrations which affect operation of the electronic device. For example, in the structures disclosed in Japanese Unexamined Patent Application Publication (JP-A) No. 2009-70530 and Japanese Utility Model Registration No. 3130774, vibrational energy consumed by the vibration absorbing member is not efficiently taken in the vibration absorbing member. Therefore, an electronic device which vibrates itself such as an HDD or an optical disc drive (ODD) may fail due to vibrations which itself causes. Further, there still is room for improvement in that the amount of a material of the shock absorbing structure used in a holding member for the electronic device is large.

A better vibration suppression structure for an electronic device which comprehensively considers the above is desired.

SUMMARY OF THE INVENTION

An object of this invention is to provide a vibration suppression structure for reducing vibrations which affect operation of an electronic device to be used in an information processing system in which the electronic device is removably connected.

According to one embodiment of this invention, there is provided a vibration suppression mechanism for an electronic device, the vibration suppression mechanism including: a holding unit that is constructed such that a vibration absorbing member is used at a contacting portion on a first surface of a holding member for supporting the electronic device, and a contact member protruding from a second surface of the holding member which is opposite to the first surface is held by the vibration absorbing member; and a housing for holding the holding unit in a mounted state under a state in which one of the vibration absorbing member used at the contacting portion on the first surface and the contact member protruding from the second surface abuts against a holding structure.

According to one embodiment of this invention, there is provided a holding unit for an electronic device, the holding unit including: a holding member having, on a first surface thereof, a contacting portion using a vibration absorbing member; and a contact member held by the vibration absorbing member in a state of protruding from a second surface of the holding member which is opposite to the first surface.

According to one embodiment of this invention, there is provided a holding member of a holding unit for an electronic device, the holding member including: a rail to be a slid mechanism in relation to a guide in a rack housing; a vibration absorbing member provided at a contacting portion for supporting the electronic device; and a contact member that is held by the vibration absorbing member and protrudes from a surface of the vibration absorbing member that is opposite to the contacting portion to be brought into contact with the guide in the rack housing.

According to one embodiment of this invention, it is possible to provide the vibration suppression structure for reducing vibrations which affect the operation of the electronic device used in the information processing system in which the electronic device is removably connected.

DETAILED DESCRIPTION OF THE PREFERRED EMBODIMENTS

Embodiments of this invention are described with reference to FIG. 1 to FIG. 11.

Figure 1:
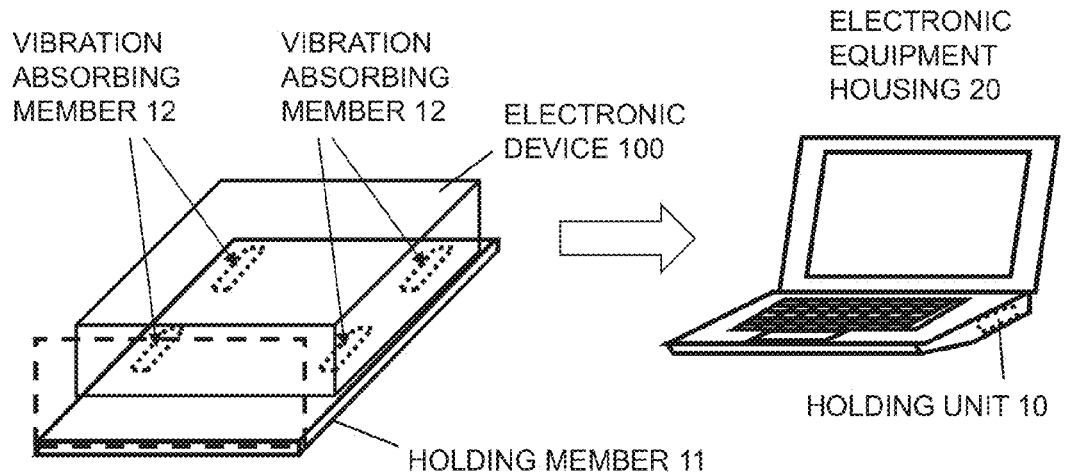
FIG. 1 is a schematic view illustrating an exemplary vibration suppression mechanism for an electronic device according to a first embodiment of this invention.
Figure 2:
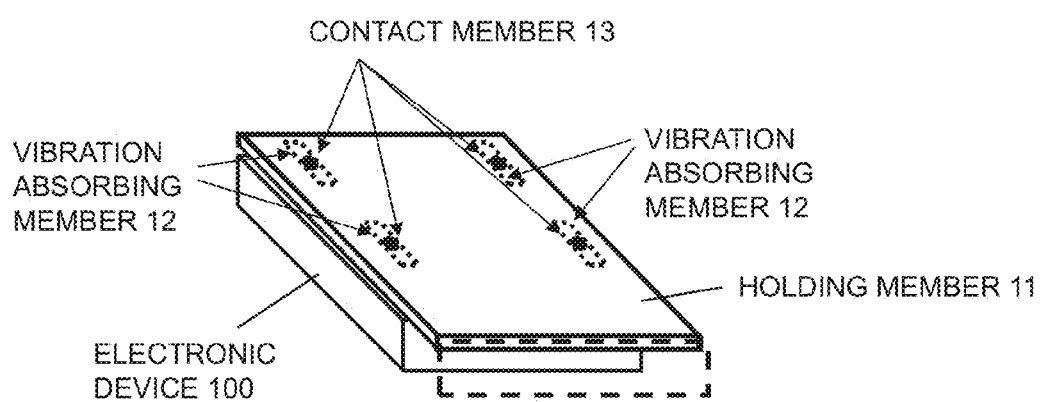
FIG. 2 is a schematic view illustrating a rear surface of a holding unit for the electronic device illustrated in FIG. 1.
Figure 3:
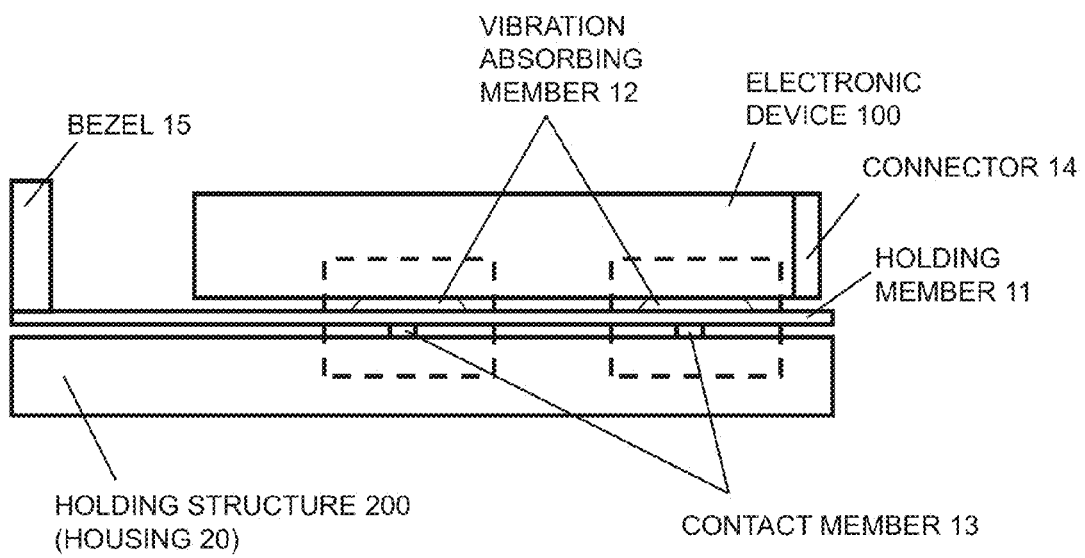
FIG. 3 is a schematic view illustrating a side surface of the holding unit for the electronic device illustrated in FIG. 1.
Figure 4:
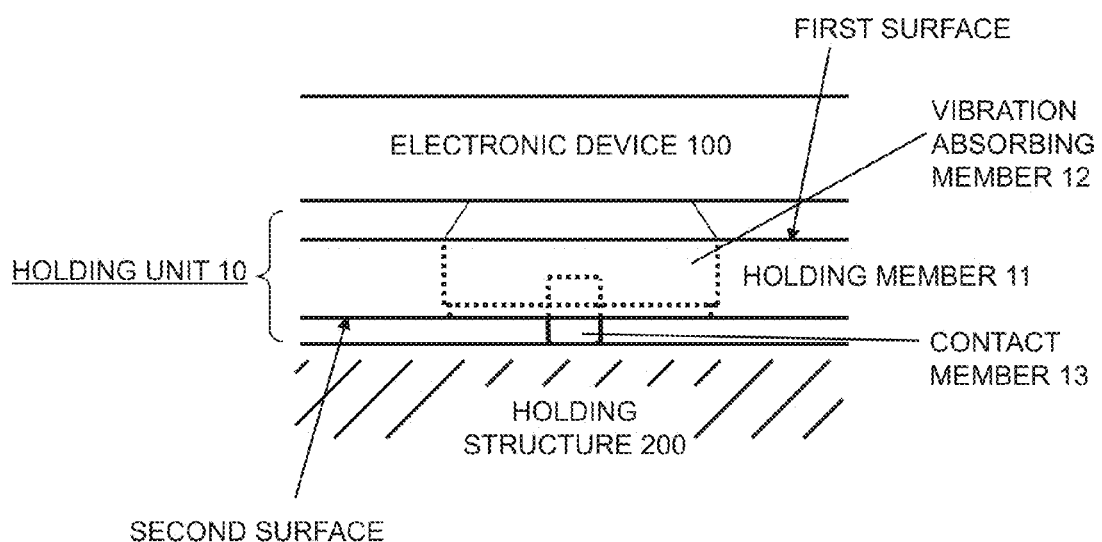
FIG. 4 is an enlarged schematic view illustrating a structure in section of a vibration suppression mechanism portion according to the first embodiment.

FIG. 1 to FIG. 4 are schematic views illustrating a vibration suppression mechanism for an electronic device 100 according to a first embodiment of this invention. FIG. 1, FIG. 2, and FIG. 3 are schematic views of the vibration suppression mechanism under a state of supporting the electronic device 100 on a first surface side thereof and being held in contact with a holding structure 200 on a second surface side thereof. FIG. 4 is an enlarged schematic view illustrating a structure in section of a portion in which a holding unit 10 is held in contact with the electronic device 100 and the holding structure 200.

As illustrated in FIG. 1, the vibration suppression mechanism for the electronic device is substantially broken down into an electronic equipment housing 20 and the holding unit 10 removably connected to the housing 20.

The holding unit 10 includes a holding member 11 for supporting the electronic device 100. In this embodiment, only a bottom surface of the electronic device 100 is supported. However, as described in other embodiments described below, two or more surfaces may be supported.

Vibration absorbing members 12 are arranged on a portion of the holding member 11 held in contact with the electronic device 100 (first surface side of the holding member 11, i.e., top surface in FIG. 1). It is desired that the electronic device 100 be fixed to the holding member 11 using a screw, a double-faced tape, or the like. On the other hand, the electronic device 100 may be fixed to the holding member 11 by structurally fitting the electronic device 100 into the holding member 11 (holding unit 10). Also in this case, in the holding member 11, the vibration absorbing members 12 are arranged between the electronic device 100 and the housing 20. Note that, there may be a portion other than the vibration absorbing members 12 at which the holding member 11 and the electronic device 100 are held in contact with each other. For example, a member for antistatic purposes or for antishock purposes may be included.

Further, as illustrated in FIG. 2, contact members 13 protrude on a second surface side (top surface in FIG. 2) of the holding member 11. The contact members 13 are members which are brought into contact with the holding structure 200 provided on the housing 20 side when the holding unit 10 which supports the electronic device 100 is held in the housing 20. The contact members 13 are held by the vibration absorbing members 12, and are held by the holding member 11 via the vibration absorbing members 12. Usage of a low-friction material for the contact members 13 facilitates mounting/removal in relation to the electronic device 100 and the holding structure 200.

The housing 20 of the electronic equipment includes the holding structure 200 as a structure for holding the holding unit 10. As described above, the holding structure 200 is brought into contact with the contact members 13 included in the holding unit 10 when the holding unit 10 which supports the electronic device 100 is held in the housing 20.

As necessary, the holding structure 200 may be structured as a guide member for assisting the mounting/removal of the holding unit 10 (holding member 11).

FIG. 3 is a schematic view illustrating a side surface side of the holding unit 10 illustrated in FIG. 1. FIG. 3 emphatically illustrates scale of the structure of portions which suppress vibrations. Further, portions surrounded by the broken lines in FIG. 3 correspond to a schematic view illustrating a structure in section of FIG. 4. Note that, a connector 14 illustrated in FIG. 3 is a connector for electrical contact of the electronic device 100, and may be connected to the main body of the electronic equipment appropriately as the application requires. Further, a bezel 15 of the holding unit 10 may be appropriately provided depending on the application and the outer appearance of the electronic equipment.

As illustrated in the structure in section of FIG. 4, the holding unit 10 has, on the first surface side of the holding member 11, contacting portions with the vibration absorbing members 12. Further, the holding unit 10 has, on the second surface side, contacting portions with the contact members 13.

Further, the holding unit 10, in a state of being mounted to the housing 20, abuts against the electronic device 100 via the first surface and abuts against the holding structure 200 via the second surface. Further, the vibration absorbing members 12 and the contact members 13 are sandwiched between the electronic device 100 and the holding structure 200.

The holding member 11 holds the contact members 13 through the vibration absorbing members 12 in a protruding manner. Each of the contact members 13 includes a protruding portion held in contact with the holding structure 200 and a portion which supports the protruding portion. The supporting portions are held by the vibration absorbing members 12.

Figure 5:
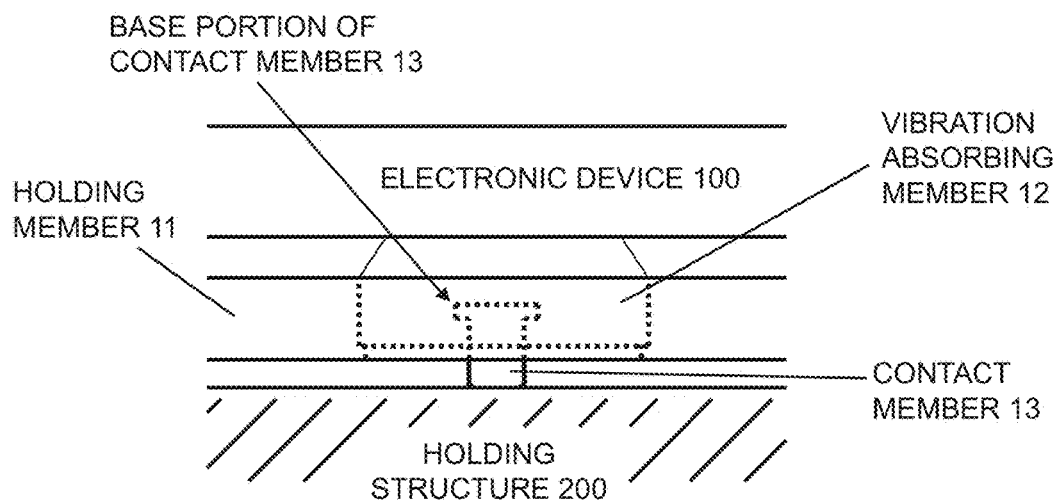
FIG. 5 is an enlarged schematic view illustrating another structure in section of the vibration suppression mechanism portion.

FIG. 5 is a schematic view illustrating another structure in section to replace the structure in section illustrated in FIG. 4. Note that, the electronic device 100 is provided on the first surface side. The electronic device 100 may be provided on the second surface side. The same can be said with regard to other structures in section to be described below.

As described above, the holding member 11 holds the contact members 13 through the vibration absorbing members 12 in a protruding manner.

Each of the contact members 13 includes a protruding portion held in contact with the holding structure 200 and a portion which supports the protruding portion. It is desired that a base portion be provided to the portion of each of the contact members 13 which is embedded in the vibration absorbing member 12 as illustrated in FIG. 5.

The base portion of the contact member 13 not only prevents the contact member 13 from coming out of the vibration absorbing member 12 but also has the effect of assisting the vibration absorbing member 12 in absorbing vibrations (absorbing energy). Further, change in the structure of the base portion may enable more absorption of certain oscillatory waves. The effect of absorbing and reducing certain oscillatory waves may be confirmed by comparing some actual measurements.

It is desired that only the vibration absorbing member 12 be interposed between the base portion of the contact member 13 and (the shell of) the electronic device 100 as illustrated in FIG. 5.

In other words, it is desired that the contact member 13 be mounted to the holding member 11 so that the base portion thereof be covered with the vibration absorbing member 12 and the protruding portion thereof exists.

Note that, the protruding portion and the base portion of the contact member 13 may be integrally formed, or may be formed by bonding or adhering different parts.

Figure 6:
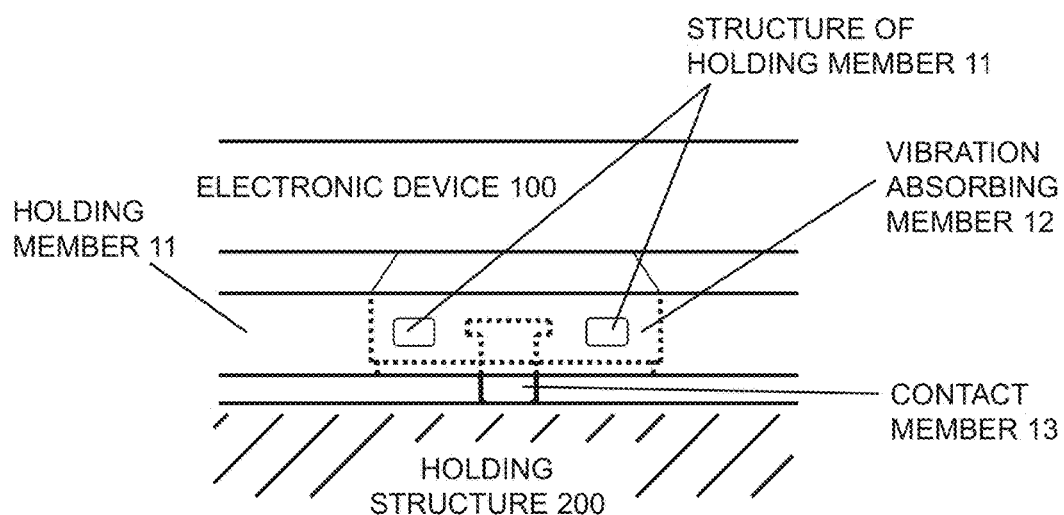
FIG. 6 is an enlarged schematic view illustrating still another structure in section of the vibration suppression mechanism portion.

FIG. 6 is a schematic view illustrating still another structure in section to replace the structure in section illustrated in FIG. 4.

With reference to FIG. 6, in the holding member 11, molded portions which are integral with the holding member 11 (structure of the holding member 11 in FIG. 6) are provided on both sides of the base portion of the contact member 13 so as to be flush therewith in FIG. 6. The molded portions have a positional relationship of being arranged at substantially equivalent distances from the shell of the electronic device 100.

The molded portions not only serve as cores but also assist in absorbing vibrations. Further, it is preferred that the molded portions are in the shape of a prism. Alternatively, the molded portions may be in the shape of a cylinder. The distance (interval) between the molded portions provided on both sides of the contact member 13 may be adjusted to be used for changing (dispersing, sliding, or the like) the resonance frequency (resonance point) of the holding member 11.

Figure 7:
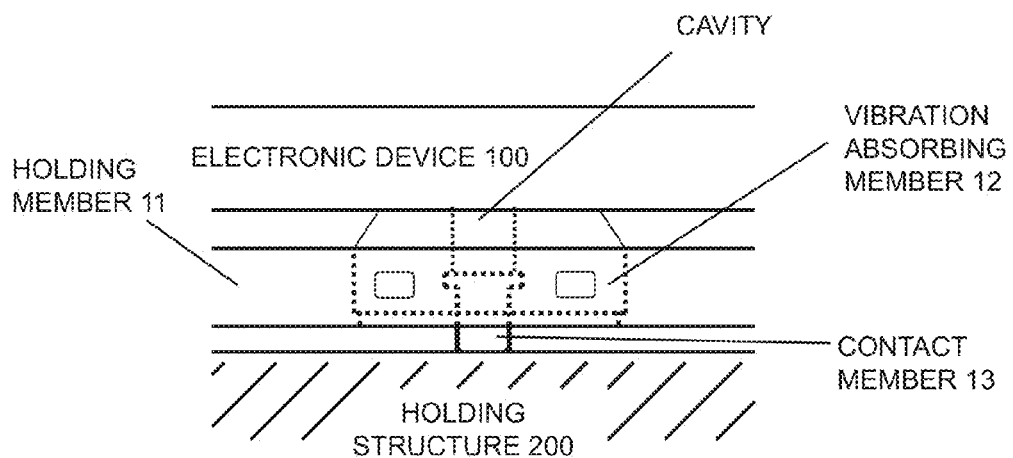
FIG. 7 is an enlarged schematic view illustrating yet another structure in section of the vibration suppression mechanism portion.

FIG. 7 is a schematic view illustrating yet another structure in section to replace the structure in section illustrated in FIG. 4.

With reference to FIG. 7, similarly to the structure illustrated in FIG. 6, in the holding member 11, molded portions which are integral with the holding member 11 are provided on both sides of the base portion of the contact member 13 so as to be flush therewith in FIG. 6. In addition, the holding member 11 has a cavity which is larger than the diameter of a contacting portion of the contact member 13 at a contacting portion between the vibration absorbing member 12 and the base portion of the contact member 13. The cavity may be equivalent to the diameter of the contacting portion.

The diameter of the cavity and the material of the vibration absorbing member 12 may be adjusted to be used for changing (dispersing, sliding, or the like) the resonance frequency (resonance point) of the holding member 11.

Figure 8:
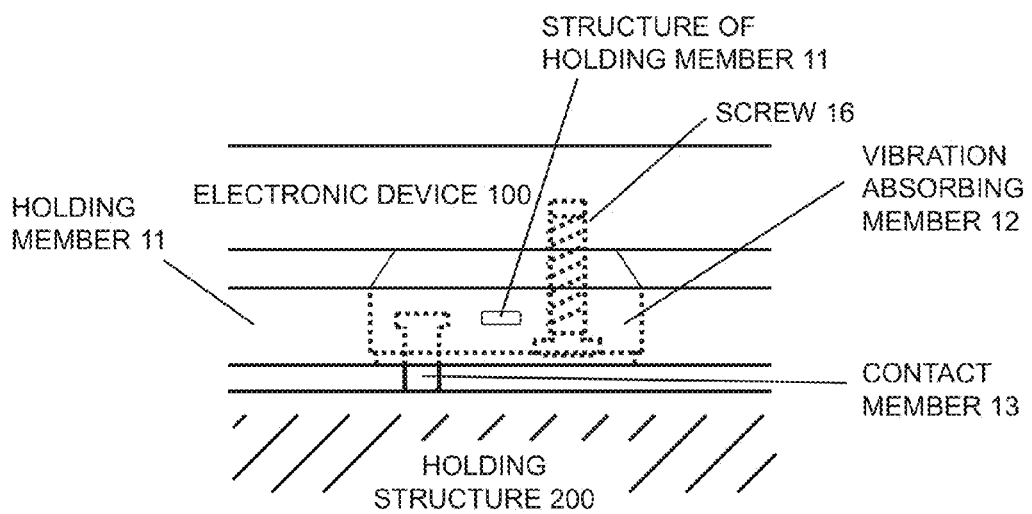
FIG. 8 is an enlarged schematic view illustrating a further structure in section of the vibration suppression mechanism portion.

FIG. 8 is a schematic view illustrating a further structure in section to replace the structure in section illustrated in FIG. 4.

In this holding unit 10, the electronic device 100 is screwed into the holding member 11 using a screw 16. FIG. 9A to FIG. 9D illustrate variations of the structure illustrated in FIG. 8.

With reference to FIG. 8, in the holding member 11, the contact member 13 and the screw 16 are provided on both sides, respectively, of the molded portion which is integral with the surrounding holding member 11. The screw 16 is screwed into a receiving structure (female thread) provided in the shell of the electronic device 100 to screw the holding member 11 and the electronic device 100 together.

Figure 9A:
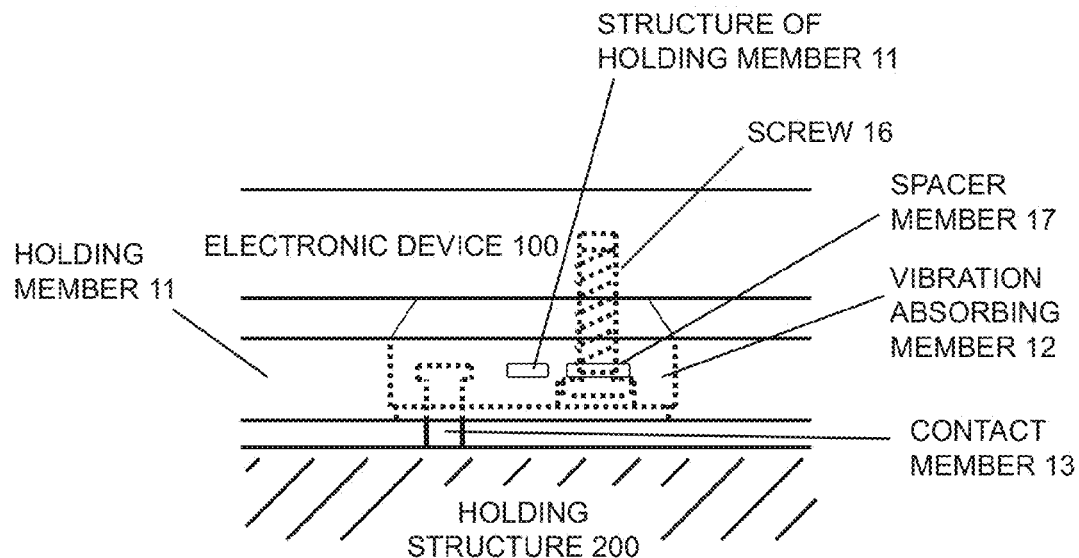
FIG. 9A is a schematic view illustrating a variation of the structure in section of the vibration suppression mechanism portion illustrated in FIG. 8.

With reference to FIG. 9A, in the holding member 11, the molded portion which is integral with the surrounding holding member 11 and a spacer member 17 are provided so as to be flush with the base portion of the contact member 13. The molded portion and the spacer member 17 have a positional relationship of being arranged at substantially equivalent distances from the shell of the electronic device 100.

The spacer member 17 is a member which receives the screw 16 to be screwed into the electronic device 100, and is held by the holding member 11 via the vibration absorbing member 12. The positional relationship between the spacer member 17 and the contact member 13 causes the vibration absorbing member 12 to work effectively.

Figure 9B:
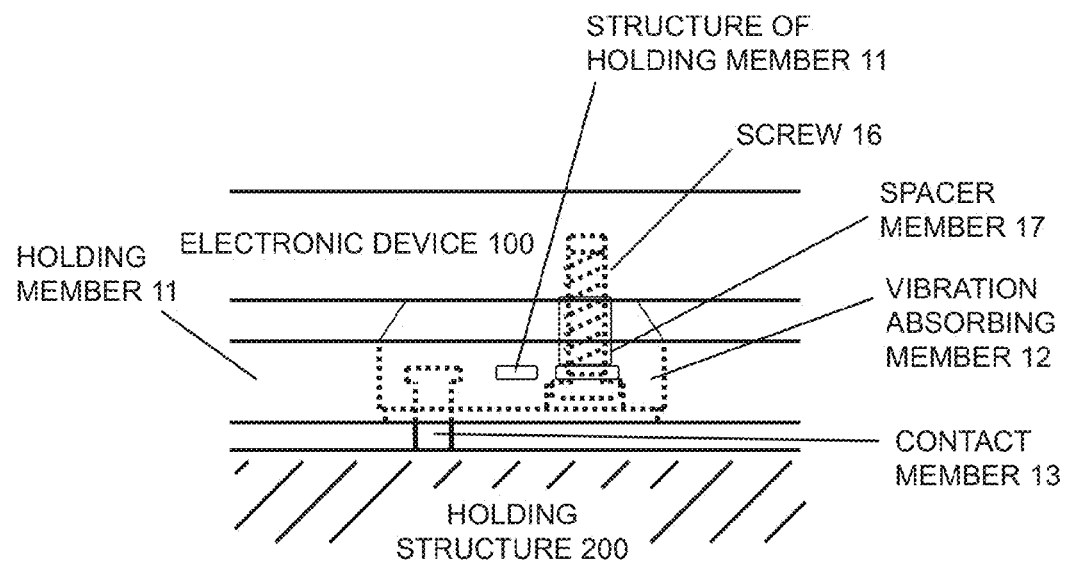
FIG. 9B is a schematic view illustrating another variation of the structure in section of the vibration suppression mechanism portion illustrated in FIG. 8.

Further, the spacer member 17 may be in a shape which is directly held in contact with the electronic device 100, as illustrated in FIG. 9B. The shape may be used for changing (dispersing, sliding, or the like) the resonance frequency (resonance point) of the holding member 11.

Figure 9C:
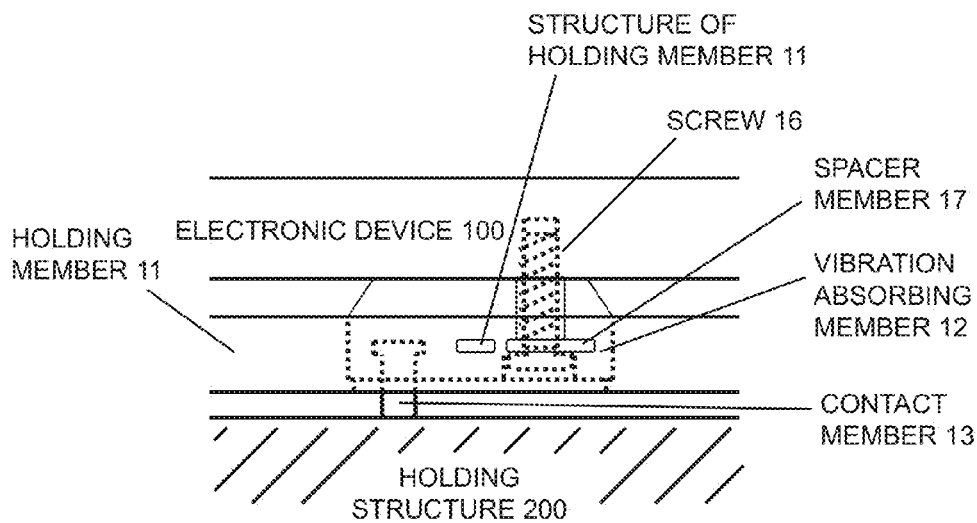
FIG. 9C is a schematic view illustrating still another variation of the structure in section of the vibration suppression mechanism portion illustrated in FIG. 8.

Further, the spacer member 17 may be in an oval shape as illustrated in FIG. 9C. The shape may be used for changing (dispersing, sliding, or the like) the resonance frequency (resonance point) of the holding member 11 and enhancing the effect of absorbing vibrations.

Figure 9D:
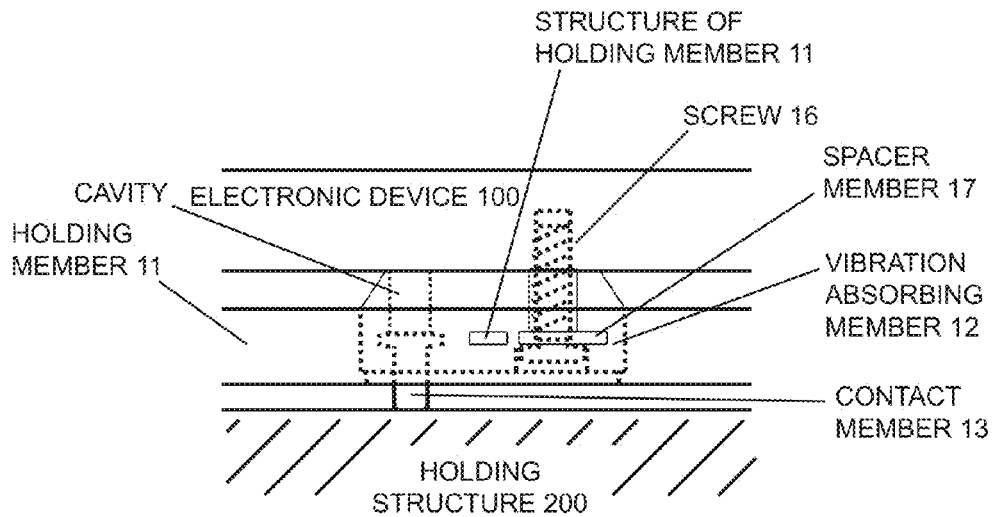
FIG. 9D is a schematic view illustrating yet another variation of the structure in section of the vibration suppression mechanism portion illustrated in FIG. 8.

Further, in the vibration absorbing member 12, as illustrated in FIG. 9D, a cavity which is larger than the diameter of the contacting portion of the contact member 13 may be provided at the contacting portion between the vibration absorbing member 12 and the base portion of the contact member 13. The diameter of the cavity, the material of the vibration absorbing members 12, the positional relationship with the spacer member 17, and the like may be adjusted to be used for changing (dispersing, sliding, or the like) the resonance frequency (resonance point) of the holding member 11.

By forming the holding unit 10 in this way, a vibration suppression mechanism which causes the vibration absorbing members 12 incorporated into the holding member 11 to absorb more easily vibrations that adversely affect operation of the electronic device 100 may be formed. Further, by changing the shapes of and positional relationship between members which form the holding member 11, resonance vibrations at a certain frequency may be absorbed and reduced, and the resonance point may be moved.

These effects are obtained by giving the above-mentioned structure to the holding unit 10 which is interposed between the electronic device 100 and the housing member of the electronic equipment (namely, holding structure 200). This function is brought about by using the vibration absorbing members 12 at contacting portions on the first surface side, by protruding the contact members 13 from the second surface opposite thereto of the holding member 11 for supporting the electronic device 100, and by contacting both the surfaces with the electronic device 100 and the holding structure 200, respectively. In other words, by adopting the above-mentioned structure, vibrations which become a problem related to operation of the electronic device 100 may be effectively absorbed by the vibration absorbing members 12.

Note that, the internal structure on the housing 20 side (structure of the holding structure 200) of the electronic equipment is not specifically limited insofar as a typical structure which enables mounting/removal is possible is adopted and the contacting portion of the vibration absorbing member 12 or the contact member 13 may abut against the structure in the mounted state.

Next, a second embodiment of this invention is described. Note that, description of portions similar to those in the first embodiment is made only in brief or omitted.

Figure 10:
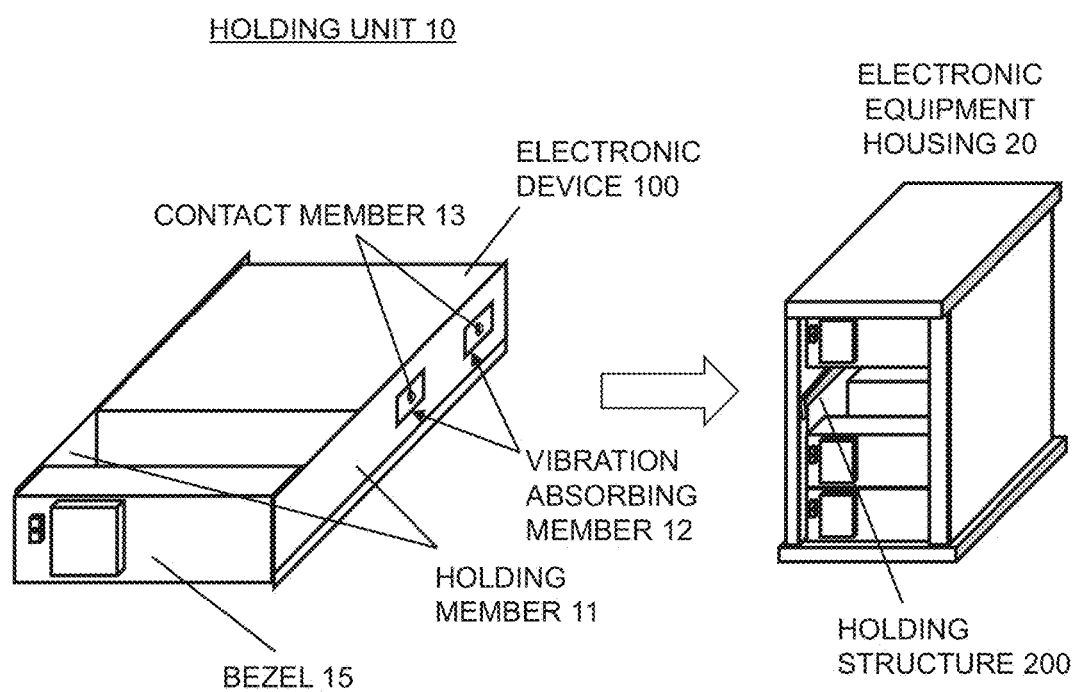
FIG. 10 is a schematic view illustrating an exemplary vibration suppression mechanism for an electronic device according to a second embodiment of this invention.

FIG. 10 is a schematic view illustrating a vibration suppression mechanism for the electronic device 100 according to the second embodiment.

As illustrated in FIG. 10, the vibration suppression mechanism for the electronic device 100 is substantially broken down into the electronic equipment housing 20 and the holding unit 10 removably connected to the housing 20. A plurality of holding units 10 may be inserted into/extracted from the electronic equipment housing 20.

The holding unit 10 is U-shaped and includes a pair of holding members 11 for supporting the electronic device 100. In this embodiment, two surfaces, i.e., right and left surfaces, of the electronic device 100 are configured to be supported.

The holding member 11 has contacting portions with the electronic device 100 on the side of the first surface (inside of the holding member 11) at which the vibration absorbing members 12 are arranged. Further, the holding member 11 is structured so as to have contacting portions with the holding structure 200 on the side of the second surface (outside of the holding member 11) from which the contact members 13 protrude. The contact members 13 are held by the vibration absorbing members 12, and are held by the holding member 11 via the vibration absorbing members 12. Usage of a low-friction material for the contact members 13 facilitates mounting/removal in relation to the holding structure 200.

The housing 20 of the electronic equipment includes the holding structure 200 as a structure for holding the holding unit 10. As described above, the holding structure 200 is brought into contact with the contact members 13 included in the holding unit 10 when the holding unit 10 which supports the electronic device 100 is held in the housing 20. Each of the vibration absorbing members 12 may adopt the structures in section described in the first embodiment. Note that, the vibration absorbing members 12 are not necessarily required to adopt the same structure in section, and may adopt different structures in section depending on, for example, the source of vibrations of the electronic device.

By forming the holding unit 10 in this way, the action and effects described in the first embodiment are obtained. Further, by holding a plurality of surfaces of the electronic device, various vibration suppression structures may be formed. In addition, oscillatory waves (vibrations from the outside) which are caused by electronic devices 100 arranged side by side in proximity to one another may be suppressed. Further, self-caused oscillatory waves (emission vibrations) may be suppressed.

Further, in the above description of the first and second embodiments, structures of the holding unit 10 which support one or two surfaces of the electronic device 100 are described. However, this invention is not limited thereto, and a structure which supports three surfaces of the electronic device 100 is included therein. Further, structures which support four, five, or six surfaces of the electronic device 100 may also be used.

Next, a third embodiment of this invention is described. Note that, description of portions similar to those in the first and second embodiments is made only in brief or omitted.

Figure 11:
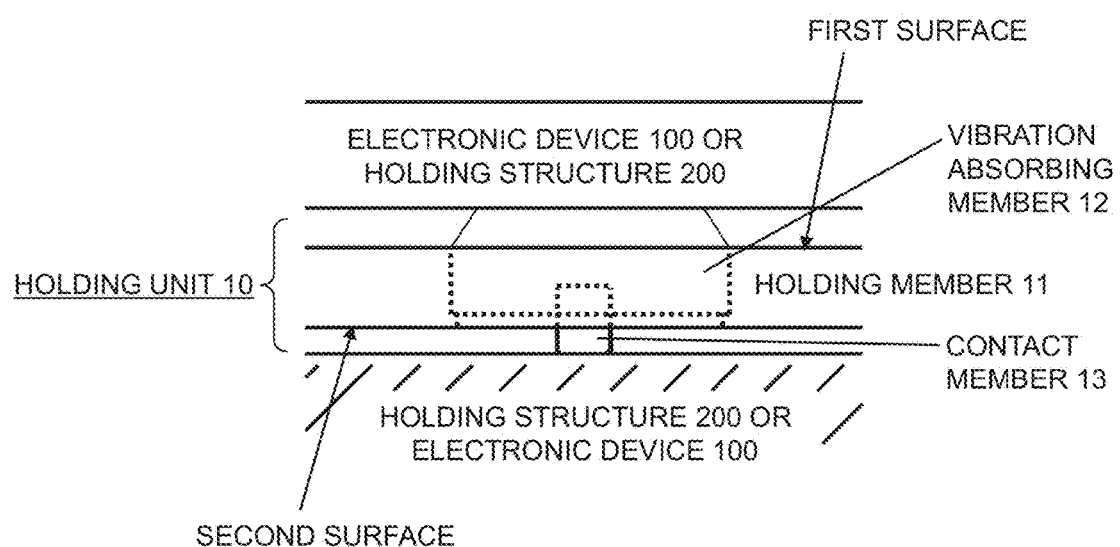
FIG. 11 is a schematic view illustrating an exemplary vibration suppression mechanism for an electronic device according to a third embodiment of this invention.

As in the structure in section illustrated in FIG. 11, the holding unit 10 has a contacting portion which is the vibration absorbing member 12 on the first surface side of the holding member 11. Further, the holding unit 10 has a contacting portion which is the contact member 13 on the second surface side of the holding member 11.

Further, as illustrated in FIG. 11, the structure held in abutment against the electronic device 100 and the structure held in abutment against the holding structure 200 (structures on the first surface side and on the second surface side) are interchangeable. Further, the vibration absorbing members 12 are not necessarily required to have the structures on the first surface side and the structures on the second surface side which are flush with one another, respectively, and may adopt surface structures which are different from one another.

In other words, the holding unit 10 is held in abutment against the electronic device 100 and the holding structure 200 via the first surface and the second surface in a state of being mounted to the housing 20, and the vibration absorbing member 12 and the contact member 13 are sandwiched between the electronic device 100 and the holding structure 200.

The holding member 11 holds the contact member 13 through the vibration absorbing member 12 in a protruding manner. The contact member 13 is held by the vibration absorbing member 12 and held in contact with the electronic device 100 or the holding structure 200.

By forming the holding unit 10 in this way, the action and effects described in the first and second embodiments are obtained. Further, design flexibility is obtained with regard to the structure of the holding unit 10.

Next, an example of this invention is described.

This example is a vibration suppression mechanism relating to an HDD holding unit for an aggregate server.

Figure 12:
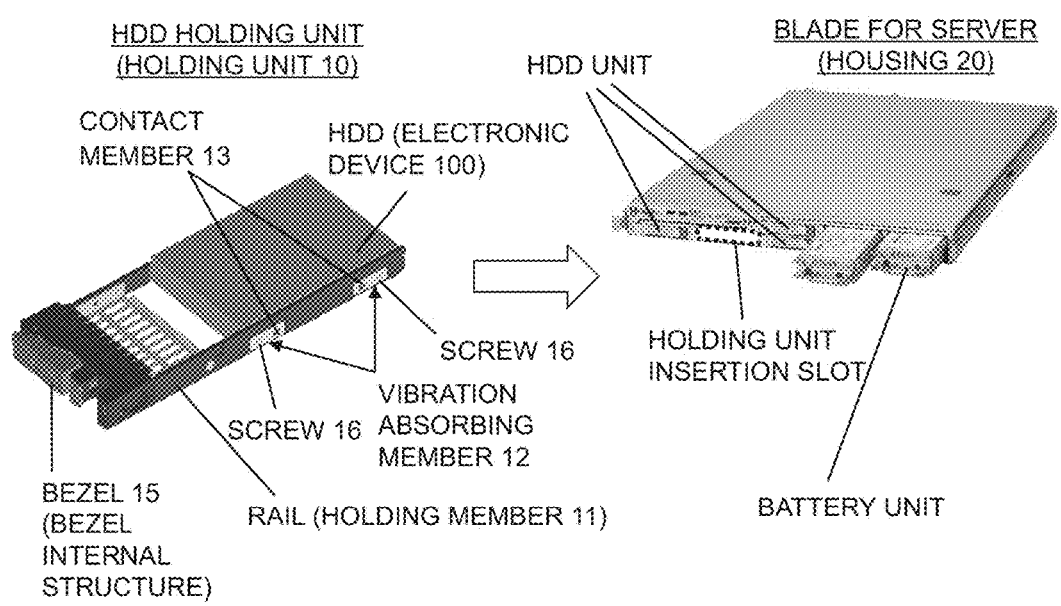
FIG. 12 is a schematic view illustrating a vibration suppression mechanism for an HDD according to an example of this invention.

FIG. 12 exemplifies a vibration suppression mechanism of an HDD (Hard Disk Drive). In this example, as in many servers, the adopted structure includes a pair of guides provided in a blade housing for a rack server (holding housing 200) and the holding member 11 of the HDD holding unit which is a pair of rails, which are used to enable mounting/removal of an HDD unit (HDD and HDD holding unit) by sliding the HDD unit.

The HDD holding unit uses the holding member 11 for supporting the HDD as rail members, and uses the vibration absorbing members 12 at contacting portions between the HDD and the rail members (first surface side).

Further, the HDD holding unit covers, with the vibration absorbing members 12, the contact members 13 which protrude from the second surface of the holding member 11.

The contact members 13 are brought into contact with the guides on surfaces, respectively, under a state in which the HDD unit is mounted.

A docking connector for establishing electrical connection is provided on a rear surface of the HDD unit.

With regard to the structure of the blade housing, similarly to a conventional structure, a pair of guides formed of a metal or a resin is provided in a holding unit insertion slot, and a docking connector for establishing electrical connection with the HDD unit is provided.

As necessary, an access lamp for indicating the operating state of the HDD, and a lever or a button for mounting/removal may be provided at the bezel 15 of the HDD holding unit.

Note that, in this example, an HDD rack such as a data center or a server room which enables hot swap during operation is described, but a structure for mounting/removing the electronic device 100 such as an ODD, a solid state drive (SDD), a battery, a blade itself, or the like may be similarly formed.

Further, in this example, transversely mounted blades are illustrated, but longitudinally mounted blades may be similarly formed.

Next, exemplary shapes of members forming the vibration absorbing member 12 are described.

Figure 13:
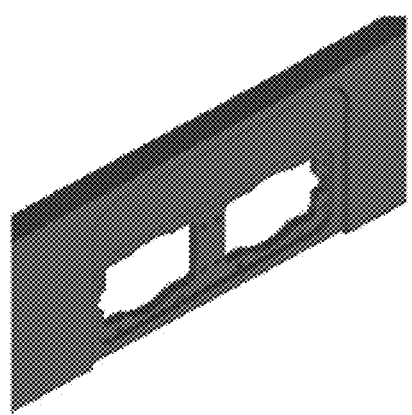
FIG. 13 is a perspective view illustrating shapes of members forming the vibration suppression mechanism according to the example.
Figure 13:
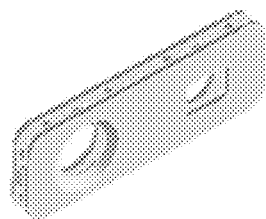
Figure 13:
Figure 13:
Figure 13:
Figure 14:
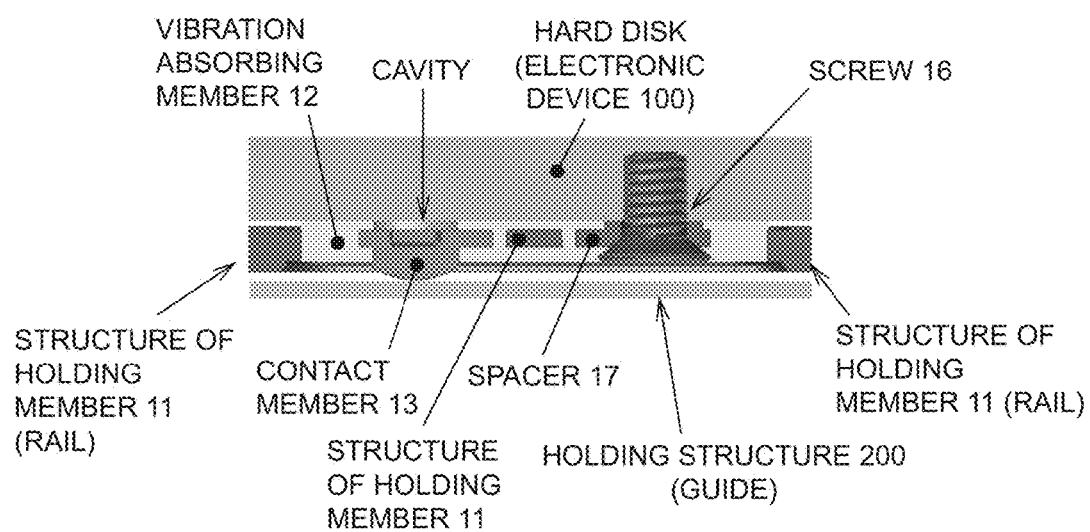
FIG. 14 is a sectional view illustrating a vibration suppression mechanism portion according to the example.

FIG. 13 is a perspective view illustrating shapes of members forming the vibration absorbing member illustrated in FIG. 12. FIG. 14 is a sectional view illustrating the assembled members illustrated in FIG. 13.

The perspective view of FIG. 13 illustrates (a) the structure of the holding member 11 (only in the vibration absorbing member 12), (b) the vibration absorbing member 12, (c) the contact member 13, (d) the spacer member 17, and (e) the screw 16. These members are assembled as illustrated in FIG. 14.

A structure in section illustrated in FIG. 14 may be formed in any way.

For example, two vibration absorbing members 12 may be bonded to both surfaces, respectively, of a portion at which the holding member 11 (rail members) is assembled so as to sandwich the contact member 13 and the spacer member 17.

Further, two vibration absorbing members 12 may be bonded so as to sandwich the structure of the holding member 11 (core), and the contact member 13 and the spacer member 17.

Further, a vibration absorbing material in a fluid state may be injected into a portion at which the holding member 11 is assembled so as to embed the structure of the holding member 11, and the contact member 13 and the spacer member 17.

Further, in the holding member 11, the contact members 13 may be sandwiched between the vibration absorbing members 12, and the two vibration absorbing members 12 which sandwich the contact members 13 may be formed of different materials. Usage of such vibration absorbing members 12 which are different from each other may assist in moving the resonance frequency (resonance point) of the rail members.

Further, the holding member 11 may be formed by, after the contact members 13 are placed at predetermined positions, injecting and processing a plurality of vibration absorbing materials. Assignment of a plurality of vibration absorbing materials having different compositions (characteristics) to different portions of one vibration absorbing member 12 may assist in moving the resonance frequency (resonance point) of the rail members.

Figure 15A:
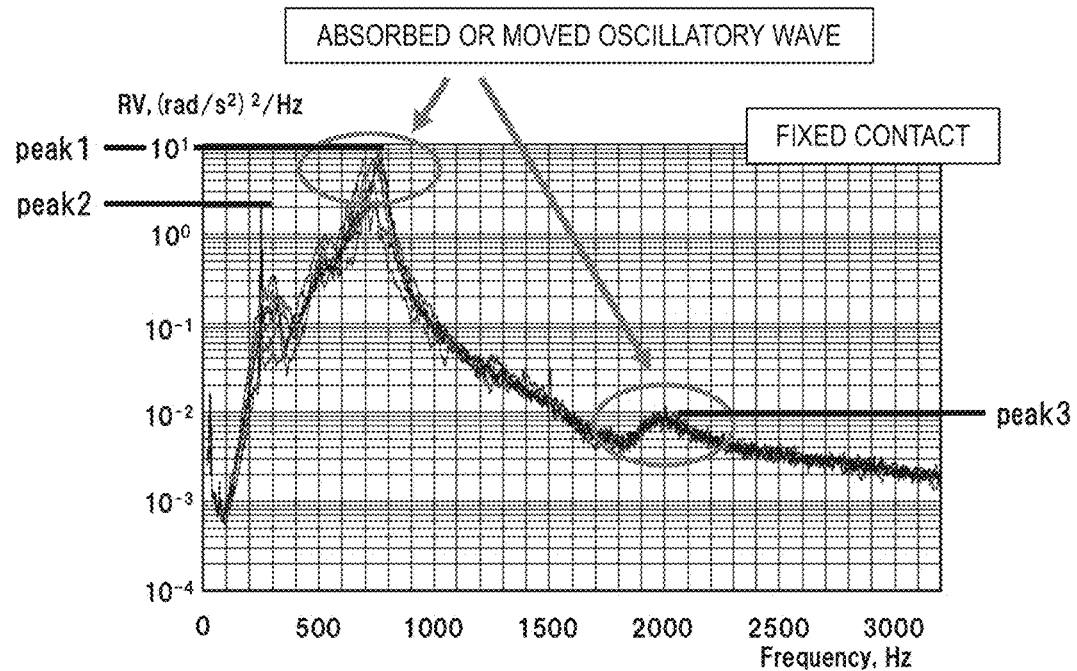
FIGS. 15A and 15B are graphs showing the result of analysis of vibration absorbing action of a contact structure in a vibration absorbing structure according to the example.
Figure 15B:
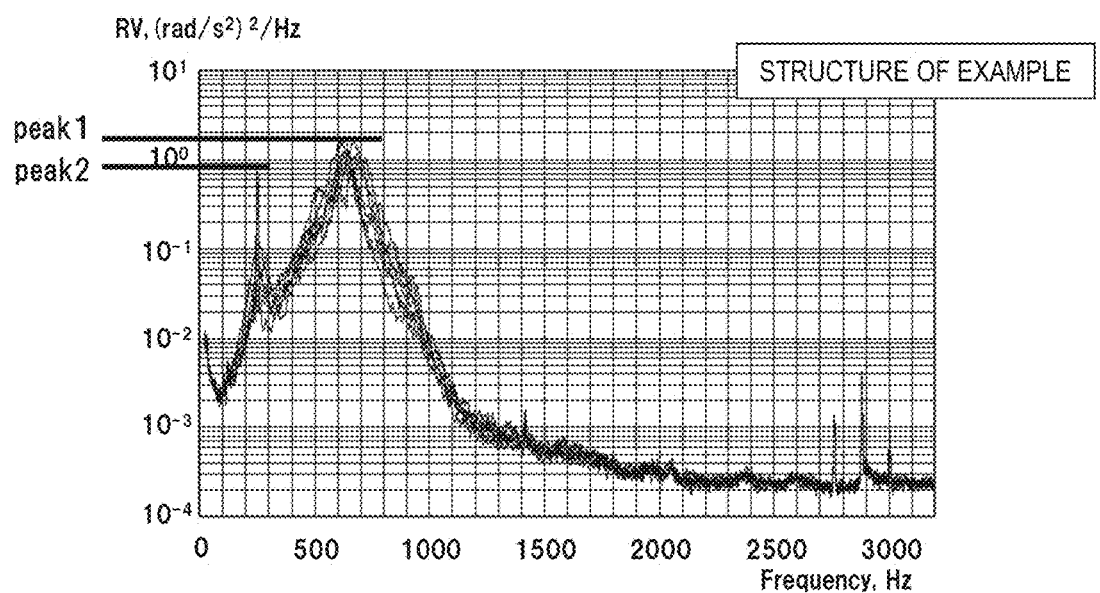

FIGS. 15A and 15B show the result of measurement of vibrations to which the mounted HDD is subjected using the HDD holding unit having the vibration absorbing structure illustrated in FIG. 12 to FIG. 14 (see FIG. 15B) and a similar HDD holding unit in which a contact is formed integrally with the HDD unit (see FIG. 15A) (the sources of the vibrations is the HDD itself and other HDDs). With regard to the HDD holding unit for comparison, the contact is formed in the core of the holding member 11 and is protruded, and shapes of other portions are substantially equivalent.

As is clear from FIGS. 15A and 15B, a lot of oscillatory waves whose sources are thought to be carriages, spindle motors, and the like of the device itself and other devices are as a whole absorbed more effectively. Further, it is confirmed that, by the structure of the example, peak values such as a peak 1 and a peak 2 shown in FIG. 15 are effectively reduced and a peak region such as a peak 3 is disappeared.

As described above, according to the vibration suppression structure of this invention, vibrations which affect operation of an electronic device used in an information processing system in which the electronic device is removably connected may be reduced.

Further, a solving method which suppresses vibrations to an electronic device, vibrations from other electronic devices, and vibrations to other electronic devices used in design analysis considering many-sided influence may be provided. Therefore, by changing the structure of the holding unit (holding member), the chronic problem of vibrations may be solved or alleviated.

Further, as described in the example, this invention may be easily applied to existing specifications of a housing structure, and may be realized in shapes according to specifications of an existing server rack, storage rack, or the like. Therefore, the problem of vibrations may be solved without changing operating conditions other than vibrations (electrical connection, integration scale, cooling, energy efficiency, specifications, and the like). For example, even if, as the HDD grows in capacity, oscillatory waves caused by a carriage, a spindle motor, and the like newly become a problem in reading/writing, the problem may be solved by reducing or moving oscillatory waves of a certain frequency band.

Note that, the specific structure of this invention is not limited to the embodiments described above, and modifications which fall within the gist of this invention are also included in this invention. For example, in the description above, a structure in which the vibration suppression structure has only one contact is described, but the vibration absorbing member may have a plurality of contact members. Further, the structure of the holding member for supporting the vibration absorbing member which is described as the core and the spacer member may have a surface unevenness. Such modifications also fall within the scope of this invention.

Further, part or whole of the above-mentioned embodiments can also be described as follows. Note that, the following supplementary notes are not intended to limit this invention.

[Supplementary Note 1]

A vibration suppression mechanism for an electronic device, the vibration suppression mechanism including:

a holding unit that is constructed such that a vibration absorbing member is used at a contacting portion on a first surface of a holding member, and a contact member protruding from a second surface of the holding member which is opposite to the first surface is held by the vibration absorbing member, the holding unit supporting the electronic device via one of the vibration absorbing member used at the contacting portion on the first surface and the contact member protruding from the second surface; and a housing for holding the holding unit in a mounted state under a state in which one of the contact member protruding from the second surface and the vibration absorbing member used at the contacting portion on the first surface abuts against a holding structure.

[Supplementary Note 2]

A vibration suppression mechanism for an electronic device, the vibration suppression mechanism including:

a holding unit that is constructed such that, in a holding member for supporting the electronic device, a vibration absorbing member is used at a contacting portion between the electronic device and the holding member, and a contact member that protrudes from a surface of the holding member that is opposite to a surface that supports the electronic device to be brought into contact with a holding structure is held by the vibration absorbing member; and a housing that includes the holding structure and holds the holding unit in a mounted state under a state in which the contact member abuts against the holding structure.

[Supplementary Note 3]

A vibration suppression mechanism for an electronic device, the vibration suppression mechanism including:

a holding unit that is constructed such that, in a holding member for supporting an electronic device, a contact member that protrudes from a surface of the holding member to abut against the electronic device is held by a vibration absorbing member, and a surface opposite to a surface that holds the electronic device is brought into contact with a holding structure via the vibration absorbing member; and a housing that includes the holding structure and holds the holding unit in a mounted state under a state in which the vibration absorbing member is held in contact with the holding structure.

[Supplementary Note 4]

A vibration suppression mechanism for an electronic device according to any one of the above-mentioned supplementary notes, in which:

the contact member includes a contacting portion to be brought into contact with one of the electronic device and the holding structure, and a base portion for supporting the contacting portion; and the holding unit is constructed such that the vibration absorbing member is interposed between the base portion and one of the electronic device and the holding structure, and the base portion is covered with the vibration absorbing member.

[Supplementary Note 5]

A vibration suppression mechanism for an electronic device according to any one of the above-mentioned supplementary notes, in which the holding unit is constructed such that the vibration absorbing member is interposed between the base portion and one of the electronic device and the holding structure, and the base portion is sandwiched by the vibration absorbing member.

[Supplementary Note 6]

A vibration suppression mechanism for an electronic device according to any one of the above-mentioned supplementary notes, in which the holding unit is constructed such that the vibration absorbing member is interposed between the base portion and one of the electronic device and the holding structure, and a cavity that is equivalent to or larger than a diameter of the contacting portion exists at a contacting portion of the vibration absorbing member with the base portion.

[Supplementary Note 7]

A vibration suppression mechanism for an electronic device according to any one of the above-mentioned supplementary notes, in which the holding unit is constructed such that the holding member holds, by the vibration absorbing member, a spacer member for receiving a screw to be screwed into the electronic device.

[Supplementary Note 8]

A vibration suppression mechanism for an electronic device according to any one of the above-mentioned supplementary notes, in which the holding member is constructed such that the spacer member held by the vibration absorbing member and the base portion of the contact member are arranged to have a positional relationship of being arranged at equivalent distances from a shell of the electronic device.

[Supplementary Note 9]

A vibration suppression mechanism for an electronic device according to any one of the above-mentioned supplementary notes, in which the electronic device is any one of an HDD, an ODD, an SSD, a battery, and a blade server.

[Supplementary Note 10]

A vibration suppression mechanism for an electronic device according to any one of the above-mentioned supplementary notes, in which the housing is any one of a server rack, a notebook personal computer, a desktop personal computer, a mobile terminal, AV equipment, and mobile AV equipment.

[Supplementary Note 11]

A vibration suppression mechanism for an electronic device according to any one of the above-mentioned supplementary notes, in which the housing is a server rack in which a plurality of the same kind of electronic devices are to be mounted in parallel with one another.

[Supplementary Note 12]

A vibration suppression mechanism for an electronic device according to any one of the above-mentioned supplementary notes, in which:

the vibration absorbing member is made of a material that performs energy conversion from vibrations to heat;

the holding member is constructed such that a contacting portion with the electronic device is provided on the first surface thereof, a contacting portion with the holding structure is provided on the second surface thereof, and the holding member is used as a rail; and the holding structure is constructed as a guide provided on the housing side.

[Supplementary Note 13]

A holding unit for an electronic device, the holding unit including:

a holding member having, on a first surface thereof, a contacting portion using a vibration absorbing member; and a contact member held by the vibration absorbing member in a state of protruding from a second surface of the holding member which is opposite to the first surface.

[Supplementary Note 14]

A holding unit for an electronic device, the holding unit including:

a holding member including a vibration absorbing member at a contacting portion for supporting the electronic device; and a contact member that is held by the vibration absorbing member of the holding member and protrudes from a surface of the holding member that is opposite to a surface that supports the electronic device to be brought into contact with a holding structure of a housing.

[Supplementary Note 15]

A holding unit for an electronic device, the holding unit including:

a holding member including a vibration absorbing member at a contacting portion with a holding structure of a housing; and a contact member that is held by the vibration absorbing member of the holding member and protrudes from a surface of the holding member that is opposite to a surface that supports the electronic device to be brought into contact with the electronic device.

[Supplementary Note 16]

A holding unit for an electronic device according to any one of the above-mentioned supplementary notes, in which:

the contact member includes a contacting portion to be brought into contact with one of the electronic device and the holding structure, and a base portion for supporting the contacting portion; and the holding member is constructed such that the vibration absorbing member is interposed between the base portion and one of the electronic device and the holding structure, and the base portion is covered with the vibration absorbing member.

[Supplementary Note 17]

A holding unit for an electronic device according to any one of the above-mentioned supplementary notes, in which the holding member is constructed such that the vibration absorbing member is interposed between the base portion and one of the electronic device and the holding structure, and the base portion is sandwiched by the vibration absorbing member.

[Supplementary Note 18]

A holding unit for an electronic device according to any one of the above-mentioned supplementary notes, in which the holding member is constructed such that the vibration absorbing member is interposed between the base portion and one of the electronic device and the holding structure, and a cavity that is equivalent to or larger than a diameter of the contacting portion exists at a contacting portion of the vibration absorbing member with the base portion.

[Supplementary Note 19]

A holding unit for an electronic device according to any one of the above-mentioned supplementary notes, in which the holding member is constructed such that the vibration absorbing member holds a spacer member for receiving a screw to be screwed into the electronic device.

[Supplementary Note 20]

A holding unit for an electronic device according to any one of the above-mentioned supplementary notes, in which the holding member is constructed such that the spacer member held by the vibration absorbing member and the base portion of the contact member are arranged to have a positional relationship of being arranged at equivalent distances from a shell of the electronic device.

[Supplementary Note 21]

A holding unit for an electronic device according to any one of the above-mentioned supplementary notes, in which:

the electronic device is an HDD;

the housing is a server rack in which a plurality of the same kind of electronic devices are to be mounted in parallel with one another;

the vibration absorbing member is made of a material that performs energy conversion from vibrations to heat;

the holding member is constructed such that a contacting portion with the HDD is provided on the first surface thereof, a contacting portion with the holding structure is provided on the second surface thereof, and the holding member is used as a rail and is placed at a contacting position on a side surface of the HDD; and the holding structure is constructed as a guide provided on the server rack side.

[Supplementary Note 22]

A rail member, including:

a rail to be a slid mechanism in relation to a guide in a rack housing;

a vibration absorbing member provided at a contacting portion for supporting an electronic device; and a contact member that is held by the vibration absorbing member and protrudes from a surface of the vibration absorbing member that is opposite to the contacting portion to be brought into contact with the guide in the rack housing.

[Supplementary Note 23]

A rail member according to any one of the above-mentioned supplementary notes, in which the rail member is constructed to sandwich the contact member with the vibration absorbing member, and one portion and another portion of the vibration absorbing member that sandwich the contact member are made of different materials.

[Supplementary Note 24]

A rail member according to any one of the above-mentioned supplementary notes, in which the rail member is formed by, after the contact member is placed at a predetermined position, injecting and processing a plurality of kinds of vibration absorbing materials.

This invention may be applied to an information processing system in which an electronic device, such as a server rack, a notebook personal computer, a desktop personal computer, a mobile terminal, AV equipment, or mobile AV equipment, is removably connected.

Further, this invention may be applied to vibration suppression of not only a discrete device such as an HDD, an ODD, an SSD, or a battery but also a blade server or an HDD unit having a plurality of electronic devices mounted thereon.

What is claimed is:

1. A vibration suppression mechanism located between an electronic device and a holding structure which has a flat surface and a guide member extended along the flat surface in a predetermined direction parallel with the flat surface, the vibration suppression mechanism comprising:

a holding member having a first surface directed towards the electronic device and a second surface directed towards the holding structure;

a vibration absorbing member directed towards the electronic device, attached to the holding member, and protruded from the holding member towards the electronic device on a side of the first surface; and a contact member attached to the holding member and protruding from the holding member towards the holding structure on a side of the second surface;

wherein the contact member protruding from the second surface is movably contacted with and guided by the guide member of the holding structure in the predetermined direction parallel with the flat surface; and wherein the vibration absorbing member is contacted with a flat surface of the electronic device, and the electronic device is fixed to the holding member;

wherein the contact member includes a contacting portion to be brought into contact with the holding structure, and a base portion for supporting the contacting portion; and wherein the holding member is constructed such that the vibration absorbing member is interposed between the base portion and the electronic device and the base portion is covered with the vibration absorbing member.

2. A vibration suppression mechanism for an electronic device according to claim 1,
wherein the holding member is constructed such that the vibration absorbing member is interposed between the base portion and the electronic device and the base portion is sandwiched by the vibration absorbing member.

3. A holding unit for an electronic device, the holding unit comprising:
a holding member which has a first surface contacted with an electronic device and a second surface which is opposite to the first surface and which is directed towards a holding structure having a guide member extended along a flat surface in a predetermined direction parallel with the flat surface;
a vibration absorbing member provided on the first surface of the holding member; and
a contact member protruding from the second surface of the holding member to be movably contacted with and guided by the guide member of the holding structure in the predetermined direction parallel with the flat surface;
wherein, when the holding unit is housed in the holding structure, the contact member is guided along and contacted with the holding structure;
wherein;
the contact member includes a contacting portion to be brought into contact with the holding structure, and a base portion for supporting the contacting portion; and
the holding member is constructed such that the vibration absorbing member is interposed between the base portion and the electronic device, and the base portion is covered with the vibration absorbing member.

4. A holding unit for an electronic device according to claim 3, wherein the holding member is constructed such that the vibration absorbing member is interposed between the base portion and the electronic device, and the base portion is sandwiched by the vibration absorbing member.

* * * * *